(12) United States Patent
Funakawa

(10) Patent No.: US 6,778,564 B2
(45) Date of Patent: Aug. 17, 2004

(54) WAVELENGTH-VARIABLE LIGHT SOURCE

(75) Inventor: Seiji Funakawa, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 374 days.

(21) Appl. No.: 10/066,062

(22) Filed: Jan. 31, 2002

(65) Prior Publication Data

US 2002/0141458 A1 Oct. 3, 2002

(30) Foreign Application Priority Data

Jan. 31, 2001 (JP) .................................. P. 2001-023938

(51) Int. Cl.⁷ .............................................. H01S 3/10
(52) U.S. Cl. .......................... 372/20; 372/32; 372/92; 372/29.015
(58) Field of Search .......................... 372/20, 32, 92, 372/7, 29.015

(56) References Cited

U.S. PATENT DOCUMENTS 4,803,692 A * 2/1989 Sakano et al. ................ 372/50
5,543,945 A * 8/1996 Kimura et al. ................ 349/19
5,581,572 A * 12/1996 Delorme et al. .............. 372/50
5,986,782 A   11/1999 Alexander et al. .......... 359/110
5,995,255 A   11/1999 Giles .......................... 359/124
2002/0118711 A1 * 8/2002 Jacquet ........................ 372/20
2002/0141458 A1 * 10/2002 Funakawa .................... 372/20

OTHER PUBLICATIONS

Electronics Letters, May 13, 1999, vol. 35, No. 10, "Optical signal quality monitor . . . ", H. Suzuki and N. Takachio, 2 pages.

* cited by examiner

Primary Examiner—Leon Scott, Jr.
(74) Attorney, Agent, or Firm—Fish & Richardson P.C.

(57) ABSTRACT

Lenses 102, 103, and 104, a diffraction grating 105, a mirror 106, a light isolator 107, an arm 108, a pulse motor 109, and a pulse motor 110 operate in conjunction for mechanically roughly adjusting the wavelength of laser light generated by an LD 101, and the wavelength of laser light generated by the LD 101 is electrically finely adjusted in a wavelength adjustment section 30.

4 Claims, 1 Drawing Sheet

WAVELENGTH-VARIABLE LIGHT SOURCE

BACKGROUND OF THE INVENTION

1. Field of the Invention

This invention relates to a wavelength-variable light source unit used in an optical measurement technical field, etc., and more particularly to a wavelength-variable light source unit that can control the wavelength more finely.

2. Description of the Related Art

High-density optical communications or dense wavelength division multiplexing (DWDM) for entering a plurality of light beams provided with different information for each wavelength into an optical fiber is realized. A wavelength-variable light source is provided for evaluating the optical characteristic of an optical fiber or any other optical element used with high-density optical communications (DWDM) as a measurement object. According to the wavelength-variable light source, the wavelength of output light can be set arbitrarily in a wavelength range of about 100 nm to 150 nm. On the other hand, this kind of wavelength-variable light source adopts a semiconductor laser (laser diode (LD)), but the LD has a nature that an originating wavelength drifts, and thus if the wavelength of emitted light is set fixedly to a constant value, the wavelength changes minutely.

Then, there is also provided a wavelength-variable light source wherein, if reference light for monitor is separated and taken out from emitted light by a photocoupler, etc., and is monitored with a wave meter, etc., and change in the wavelength is recognized, the change can be fed back into a wavelength varying mechanism under manual control, thereby calibrating the wavelength deviation.

However, with the wavelength-variable light source in the related art, the wavelength of emitted light is adjusted mechanically and thus there is a limit in finely adjusting the wavelength. That is, the wavelength varying mechanism in the wavelength-variable light source in the related art is made up of a pulse motor (or a servomotor, etc.,), a piezoelement, and the like and changes the wavelength of emitted light by mechanically adjusting the attitude of a diffraction grating, a mirror, etc., of a wavelength selection element. However, the pulse motor has a large resolution per pulse and is hard to finely adjust; this is a problem, and a backlash occurs in the mechanism driven by the pulse motor; this is also a problem.

A wavelength-variable light source of the type wherein a wavelength varying mechanism adopts a plurality of piezoelements and the expansion and contraction of the piezoelements are used to move a shaft loosely piercing the piezoelement, thereby changing the attitude of a diffraction grating, a mirror, etc., can guarantee the accuracy to some extent as compared with the wavelength-variable light source installing a pulse motor, yet minute looseness on the mechanical structure such as a stick slip occurs and the structure becomes very complicated; this is a problem. Thus, generally the wavelength accuracy of emitted light is not sufficiently guaranteed with the wavelength-variable light sources in the related arts.

SUMMARY OF THE INVENTION

It is therefore an object of the invention to provide a wavelength-variable light source having a simple structure and being capable of sweeping or calibrating a wavelength with finer accuracy.

The invention has the following features for solving the above-described problems. In the following descriptions, the components of the subject matter of the invention corresponding to those of the embodiment are referred to together with the numerals in FIG. 1.

According to the invention, there is provided a wavelength-variable light source comprising a semiconductor laser (101) with a non-reflection film (101a) given to an end face of the semiconductor laser and a wavelength varying structure (for example, lens 102, diffraction grating 106, mirror 106, arm 108, rotations haft 109, pulse motor 110, etc.,) for flexibly adjusting the wavelength of laser light generated by the semiconductor laser, characterized by controller (for example, wavelength adjustment section 30) for controlling the drive current value applied to the semiconductor laser based on the wavelength of laser light generated by the semiconductor laser.

The controller controls the drive current value applied to the semiconductor laser based on the wavelength of laser light generated by the semiconductor laser. The change rate of the wavelength of laser light generated relative to the drive current value varies depending on the physical characteristic of each semiconductor laser; for example, it is 0.3 [pm/mA]. Therefore, the accuracy of the wavelength of laser light generated by the semiconductor laser is guaranteed in this order and sweeping or calibrating the wavelength can be controlled with a finer resolution.

Since some components are added to an existing wavelength-variable light source having a wavelength varying structure for flexibly adjusting the wavelength of laser light generated by a semiconductor laser, the wavelength-variable light source of the invention can provide the advantage that rough wavelength adjustment, for example, in the 100-nm order is made mechanically with the wavelength varying structure rapidly and fine wavelength adjustment, for example, in the order of 0.1 [pm/mA] or less can be made electrically in the controller. This can reduce the manufacturing costs because the minimum improvement may be added to the existing wavelength-variable light source, and can also eliminate the need for installing a piezoelement in the wavelength varying structure, so that the structure of the wavelength-variable light source can be simplified.

According to the present invention, the wavelength-variable light source may comprise a wavelength setting section (for example, wavelength setting section 40) for setting a wavelength, wherein the controller increases or decreases the drive current value applied to the semiconductor laser in response to the difference between the wavelength set in the wavelength setting section and the wavelength of laser light generated by the semiconductor laser, thereby matching the wavelength of laser light generated by the semiconductor laser with the setup wavelength.

When the operator sets a wavelength in the wavelength setting section, the controller increases or decreases the drive current value applied to the semiconductor laser in response to the difference between the wavelength set in the wavelength setting section and the wavelength of laser light generated by the semiconductor laser, thereby calibrating the wavelength of laser light generated by the semiconductor laser. Thus, if an error factor such as a drift of the semiconductor laser or a backlash or a stick slip of the wavelength varying structure occurs, the laser light having the wavelength set by the operator can be always stably be output with fine accuracy. Therefore, it is made possible to test the test object such as an optical fiber still more precisely.

According to the invention, there is provided a wavelength-variable light source comprising a semiconductor laser with a non-reflection film given to an end face of the semiconductor laser and a wavelength varying structure for flexibly adjusting the wavelength of laser light generated by the semiconductor laser, characterized by a sweep section (for example, wavelength adjustment section 30) for sweeping the wavelength of laser light generated by the semiconductor laser by changing the drive current value applied to the semiconductor laser.

The sweep section sweeps the wavelength of laser light generated by the semiconductor laser by changing the drive current value, so that the wavelength can be swept more flexibly as compared with the related art wherein the wavelength is swept mechanically with a motor and a piezoelement. That is, in the system of sweeping the wavelength mechanically, the wavelength of laser light generated is swept only in one way either from short wavelength to long wavelength or from to short wavelength to circumvent the backlash problem. In the invention, however, the wavelength of laser light generated by the semiconductor laser is swept electrically and thus the backlash problem, etc., cannot occur. Therefore, it is made possible to sweep the wavelength of laser light generated in two ways and consecutively between the short wavelength and the long wavelength.

Here, the wavelength of laser light generated by the semiconductor laser can also be swept in accordance with any waveform such as a sine waveform. However, preferably the sweep section sweeps the wavelength of laser light generated by the semiconductor laser so that the wavelength of laser light generated by the semiconductor laser changes in accordance with a triangular waveform as in the invention as claimed in claim 4. In this case, the wavelength characteristic of an optical fiber, an optical cable, an optical device, or any other measured object can be measured in a short time.

DETAILED DESCRIPTION OF THE PRESENT INVENTION

Figure 1:
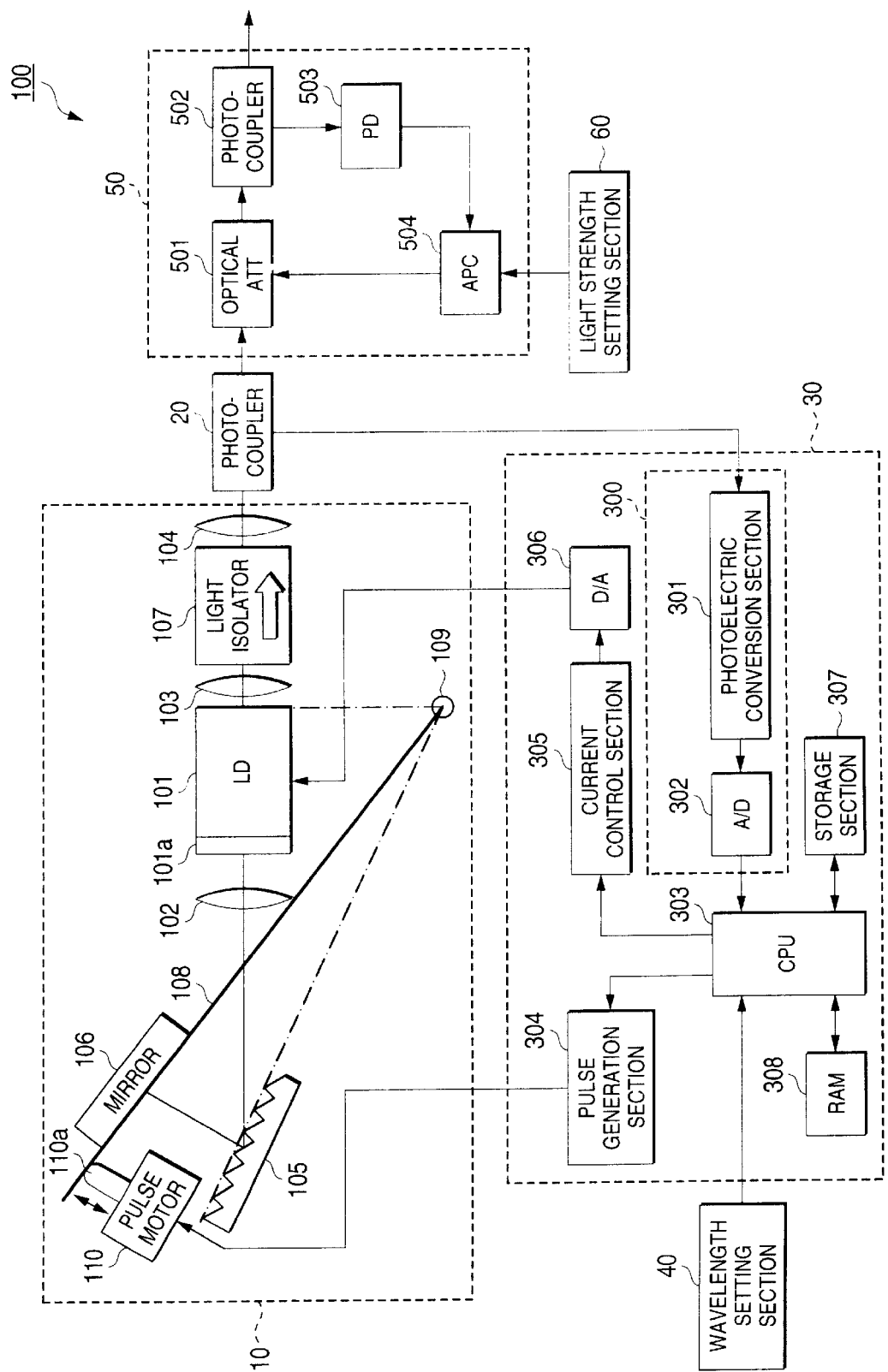
FIG. 1 is a block diagram of a variable-wavelength light source according to an embodiment of the invention.

A wavelength-variable light source 100 according to an embodiment of the invention will be discussed with reference to FIG. 1. This wavelength-variable light source 100 is made up of a light source section 10, a photocoupler 20, a wavelength adjustment section 30, awavelength setting section 40, a light strength adjustment section 50, and a light strength setting section 60.

The light source section 10 comprises a semiconductor laser (LD) 101, lenses 102, 103, and 104, a diffraction grating 105, a mirror 106, a light isolator 107, an arm 108, and a pulse motor 109. A non-reflection film 101a is given to an end face of the LD 101 on the diffraction grating 105 side.

In the light source section 10, emitted light from the end face of the LD 101 given the non-reflection film 101a is converted into collimated light through the lens 102 and the collimated light is incident on the diffraction grating 105. Of the light incident on the diffraction grating 105, only light having the wavelength determined by the positional relationship between the diffraction grating 105 and the mirror 106 is again fed back into the LD 101. Accordingly, the LD 101 generates the laser light having the wavelength. The laser light generated by the LD 101 is emitted from another end face of the LD 101, is converted into collimated light through the lens 103, passes through the light isolator 107 and then is focused on the lens 104 and is output to the photocoupler 20.

The arm 108 is attached at one end part to a rotation shaft 109 and is supported at an opposite end on an appearance shaft 110a of a pulse motor 110. The pulse motor 110 swings the arm 108 around the rotation shaft with a resolution of 15 [nm/pulse], for example, in accordance with a pulse signal from a pulse generation section 304 described later, thereby mechanically adjusting the wavelength of the laser light generated by the LD 101.

The photocoupler 20 splits output light from the light source section 10 into first reference light fed back into the wavelength adjustment section 30 and second reference light emitted to the light strength adjustment section 50.

The wavelength adjustment section 30 is made up of a wavelength detection section 300, a CPU (central processing unit) 303, the above-mentioned pulse generation section 304, a current control section 305, a D/A converter 306, a storage section 307, and RAM (random access memory) 308.

The wavelength detection section 300 detects the wavelength of output light from the light source section 10 and comprises a photoelectric conversion section 301 and an A/D converter 302. The photoelectric conversion section 301 comprises a light reception element, such as a photodiode (PD), and converts reference light provided by the photocoupler 20 into an analog electric signal responsive to the wavelength of the reference light and outputs the analog electric signal to the A/D converter 302, which then converts the analog signal output by the photoelectric conversion section 301 into a digital signal and outputs the digital signal to the CPU 303.

The CPU 303 outputs a control signal to the pulse generation section 304, the current control section 305, etc., based on the digital signal from the A/D converter 302 and the like and controls the sections totally. The pulse generation section 304 generates a pulse signal with the number of pulses responsive to the control signal from CPU 303 and applies the generated pulse signal to the pulse motor 110. The current control section 305 always applies a threshold current required for the LD 101 to generate laser light to the LD 101. Further, the current control section 305 applies a drive current responsive to the control signal from the CPU 303 to the LD 101 through the D/A converter 306 in addition to the threshold current.

The storage section 307 previously stores a first table representing the correspondence between each wavelength and the number of pulses, a second table representing the correspondence between each wavelength and the drive current value, and a third table representing the correspondence between each wavelength of laser light generated by the LD 101 and the peak voltage or the peak current value of an electric signal into which the photoelectric conversion section 301 converts the laser light although the tables are not shown. The wavelength setting section 40 comprises an input key, etc., for setting any desired wavelength in the order of 0.1 pm or less.

The light strength adjustment section 50 comprises an optical attenuator (optical ATT) 501, a photocoupler 502, a photodiode (PD) 503, and auto power controller (APC) 504.

The optical ATT 501 attenuates the light strength (power) of the second reference light distributed by the photocoupler 20 in accordance with a control signal from the APC 504. An optical amplifier may be used in place of the optical ATT 501. In this case, the light strength (power) of the second reference light can also be attenuated or amplified for performing APC (auto power control). The photocoupler 502 splits the second reference light attenuated by the optical ATT 501 or amplified into emitted light to be emitted to an optical fiber or any other measured object (not shown) and third reference light to be emitted to the PD 503.

The PD 503 receives the third reference light distributed by the photocoupler 502 and outputs an electric signal responsive to the light strength (power) of the third reference light to the APC 504. The APC 504 stores a fourth table defining the relationship between the light strength and the control amount of the optical ATT 501 and outputs a control signal to the optical ATT 501 based on comparison between the electric signal output from the PD 503 and the setup light strength set in the light strength setting section 60. The light strength setting section 60 comprises an input key, etc., for setting the strength of emitted light.

The operation of the described wavelength-variable light source 100 is as follows: To begin with, the operator sets any desired wavelength in the wavelength setting section 40 and sets any desired light strength (power) in the light strength setting section 60. When the CPU 303 senses that the wavelength has been set in the wavelength setting section 40, it stores the setup wavelength in the RAM 308. Next, the CPU 303 roughly approximates the setup wavelength stored in the RAM 308 first in units of the 100-nm order, references the first table in the storage section 307, recognizes the number of pulses corresponding to the approximated wavelength, and causes the pulse generation section 304 to generate a pulse signal with the recognized number of pulses. The pulse signal generated by the pulse generation section 304 is applied to the pulse motor 110 and the appearance shaft 101a appears in response to the pulse signal, whereby the attitude of the mirror 106 changes. Thus, the wavelength of the laser light generated by the LD 101 is roughly set.

Next, the CPU 303 subtracts the approximated wavelength from the setup wavelength stored in the RAM 308 to find the remaining wavelength and references the second table in the storage section 307, recognizes the drive current value corresponding to the remaining wavelength, and causes the current control section 305 to generate the recognized drive current. The current control section 305 further applies the drive current responsive to the instruction from the CPU 303 through the D/A converter 306 to the LD 101 in addition to the threshold current. Thus, the wavelength of the laser light generated by the LD 101 is finely set.

Consequently, the CPU 303 always monitors the wavelength the reference light based on a digital signal output from the A/D converter 302. That is, the CPU 303 references the third table in the storage section 307 and recognizes the wavelength corresponding to the peak current value of the digital signal (namely, the wavelength of the laser light generated at present by the LD 101). If the recognized wavelength deviates from the setup wavelength stored in the RAM 308 because of a drift or any other disturbance, the CPU 303 finds the difference between the setup wavelength and the present wavelength, again references the second table, recognizes the drive current value corresponding to the difference, and causes the current control section 305 to increase or decrease the drive current value as recognized. Thus, the wavelength of the laser light generated by the LD 101 is always followed by (matched with) the setup wavelength.

The emitted light of the light source section 10 with the wavelength adjusted in the wavelength adjustment section 30 is made incident on the PD 503 through the photocoupler 20, the optical ATT 501, and the photocoupler 502 and is converted into an electric signal and the provided electric signal is output to the APC 504. The APC 504 finds the difference between the setup light strength set in the light strength setting section 60 and the light strength represented by the electric signal output from the PD 503. Next, the APC 504 references the fourth table, recognizes the control amount of the optical ATT 501 corresponding to the difference, and outputs a control signal representing the recognized control amount to the optical ATT 501, which then amplifies or attenuates the emitted light of the light source section 10. Thus, the light strength of the emitted light of the light source section 10 is always followed by (matched with) the light strength set in the light strength setting section 60.

To sweep the wavelength, the operator first sets the final wavelength and the sweep time from the initial wavelength to the final wavelength in the wavelength setting section 40 and sets any desired light strength (power) in the light strength setting section 60. When the CPU 303 senses that the initial wavelength and the final wavelength have been set in the wavelength setting section 40, it stores the setup wavelengths in the RAM 308. Then, the CPU 303 first matches the wavelength of the laser light generated by the LD 101 with the initial wavelength according to a similar procedure to that described above. Next, the CPU 303 calculates the difference between the initial wavelength and the final wavelength stored in the RAM 308, references the second table in the storage section 307, and finds the drive current value of the final wavelength and the drive current value change rate to the final wavelength. It further applies the drive current value to the LD 101 through the D/A converter 306 for the sweep time to the drive current value of the final wavelength at the drive current value change rate. Thus, the wavelength of the laser light generated by the LD 101 is swept finely. To sweep the wavelength, the sweep time is set and the wavelength is gradually changed within the sweep time as described above and in addition, the sweep method can also be changed flexibly by any other method in such a manner that the initial wavelength to the final wavelength is divided into some parts and the wavelength is finely swept while stop at each division.

Next, the CPU 303 subtracts the above-mentioned approximated difference from the difference between the initial wavelength and the final wavelength stored in the RAM 308 to find the remaining wavelength and references the second table in the storage section 307, recognizes the drive current value corresponding to the remaining wavelength, and causes the current control section 305 to generate the recognized drive current. The current control section 305 further applies the drive current responsive to the instruction from the CPU 303 to the LD 101 through the D/A converter 306 in addition to the threshold current. Thus, the wavelength of the laser light generated by the LD 101 is swept finely.

The described wavelength-variable light source 100 provides the following advantages:

(1) Since the CPU 303 controls the drive current value applied to the LD 101 based on the wavelength of the laser light generated by the LD 101, the wavelength of the laser light generated by the semiconductor laser can be swept or calibrated in the order of 0.1 [pm/mA] or less, for example.

(2) The wavelength-variable light source 100 can provide the advantage that rough wavelength adjustment in the 100-nm order is made mechanically with the pulse motor, etc., rapidly and fine wavelength adjustment in the order of 0.1 mp or less can be made electrically in the current control section 305. This also eliminates the need for installing a piezoelement in the wavelength varying structure to enhance the accuracy of the wavelength, so that the structure of the wavelength-variable light source can be simplified.

(3) If a drift of the LD 101 or a backlash or a stick slip of the mechanism associated with the pulse motor occurs, the CPU 303 increases or decreases the drive current value applied to the LD 101 in response to the difference between the wavelength set in the wavelength setting section 40 and the wavelength of the laser light generated by the LD 101, thereby automatically calibrating the wavelength of the laser light generated by the LD 101, so that the laser light having the wavelength set by the operator can be always stably be output with fine accuracy.

Although the wavelength-variable light source 100 as one preferred example of the invention has been described, the detailed configuration and function of the wavelength-variable light source 100 can be changed appropriately according to a wide viewpoint of the invention, of course. For example, the wavelength setting section 40 may be placed in the light source section 10 and the wavelength adjustment section 30 may be provided with a wavelength adjustment part for the operator to adjust the wavelength. In this case, preferably a wave meter for monitoring the reference light is provided. The detailed configuration and placement in the wavelength varying mechanism can also be changed appropriately, for example, in such a manner that a beam splitter is placed in the wavelength varying mechanism in the light source section 10 for splitting light from the diffraction grating to the LD to take out output light.

The wavelength setting section 40 and the light strength setting section 60 may be provided in one piece. Further, the CPU 303 and the APC 504 may be replaced with single controller having the functions of both the CPU 303 and the APC 504. Further, the wavelength control method is not limited to table control and can also be calculation control, feedback control based on wavelength detection, or the like.

According to the invention, the accuracy of the wavelength of laser light generated by the semiconductor laser is guaranteed in the order of 0.1 [pm/mA] or less, for example, and sweeping or calibrating the wavelength can be controlled with a finer resolution. The wavelength-variable light source of the invention can provide the advantage that rough wavelength adjustment, for example, in the 100-nm order is made mechanically with the wavelength varying structure rapidly and fine wavelength adjustment, for example, in the order of 0.1 [pm/mA] or less can be made electrically in the controller. Further, since the minimum improvement may be added to an existing wavelength-variable light source, the manufacturing costs can be reduced and the need for installing a piezoelement in the wavelength varying structure can also be eliminated, so that the structure of the wavelength-variable light source can be simplified.

According to the invention, if an error factor such as a drift of the semiconductor laser or a backlash or a stick slip of the wavelength varying structure occurs, the laser light having the wavelength set by the operator can be always stably be output with fine accuracy. Therefore, it is made possible to test the test object such as an optical fiber still more precisely.

According to the invention, the wavelength can be swept more flexibly. Particularly, it is made possible to sweep the wavelength of laser light generated in two ways and consecutively between the short wavelength and the long wavelength.

According to the invention, the wavelength characteristic of an optical fiber, an optical cable, an optical device, or any other measured object can be measured in a short time.

What is claimed is:

1. A wavelength-variable light source comprising:
    a semiconductor laser having a non-reflection film provided at an end face of the semiconductor laser; the semiconductor laser generating a beam of light;
    a wavelength varying unit for flexibly adjusting the wavelength of the beam of light;
    a controller for controlling a drive current value applied to the semiconductor laser based on the wavelength of the beam of light.

2. The wavelength-variable light source as claimed in claim 1, further comprising:
    a wavelength setting section for setting a target wavelength, wherein
    the controller increases or decreases the drive current value applied to the semiconductor laser in response to the difference between the target wavelength set in the wavelength setting section and the wavelength of the beam of light, to match the wavelength of the beam of light with the target wavelength.

3. A wavelength-variable light source comprising:
    a semiconductor laser having a non-reflection film provided at an end face of the semiconductor laser, the semiconductor laser generating a beam of light;
    a wavelength varying unit for flexibly adjusting the wavelength of the beam of light; and
    a controller for changing a drive current value applied to the semiconductor laser to sweep the wavelength of the beam of light.

4. The wavelength-variable light source as claimed in claim 3, wherein the controller sweeps the wavelength of the beam of light so that the wavelength of the beam of light changes in accordance with a triangular waveform.

* * * * *